(12) United States Patent
Mizuki et al.

(10) Patent No.: US 6,828,655 B2
(45) Date of Patent: Dec. 7, 2004

(54) SEMICONDUCTOR FILM WITH LOW CRYSTAL DEFECT AND SEMICONDUCTOR DEVICE AND DISPLAY APPARATUS USING THE SEMICONDUCTOR FILM

(75) Inventors: Toshio Mizuki, Nara (JP); Yoshinobu Nakamura, Daito (JP)

(73) Assignee: Sharp Kabushiki Kaisha, Osaka (JP)

( * ) Notice: Subject to any disclaimer, the term of this patent is extended or adjusted under 35 U.S.C. 154(b) by 25 days.

(21) Appl. No.: 10/294,760

(22) Filed: Nov. 15, 2002

(65) Prior Publication Data

US 2003/0132505 A1 Jul. 17, 2003

(30) Foreign Application Priority Data

Jan. 11, 2002 (JP) ........................................ 2002-005403
Sep. 17, 2002 (JP) ........................................ 2002-270726

(51) Int. Cl.[7] .............................................. H01L 29/00
(52) U.S. Cl. ........................ 257/538; 257/538; 257/65
(58) Field of Search ................................ 257/538, 628, 257/607, 627, 611, 533, 536; H01L 21/20, 21/25

(56) References Cited

U.S. PATENT DOCUMENTS 5,838,058 A * 11/1998 Kitajima et al. ............ 257/628
6,337,229 B1     1/2002  Yamazaki et al.

FOREIGN PATENT DOCUMENTS

JP          2000-150382          5/2000

OTHER PUBLICATIONS

A. Hara et al.; "Limit of Mobility Enhancement of Excimer Laser Crystallized Poly–Si TFTs"; *Technical Report of IEICE*; vol. 100, No. 2; pp 27–32.

* cited by examiner

*Primary Examiner*—David Nelms
*Assistant Examiner*—Thinh T Nguyen
(74) *Attorney, Agent, or Firm*—Nixon & Vanderhye P.C.

(57) ABSTRACT

A semiconductor film comprising a polycrystalline semiconductor film provided on a substrate having an insulating surface. Nearly all crystal orientation angle differences between adjacent crystal grains constituting the polycrystalline semiconductor film are present in the ranges of less than 10° or 58°–62°.

6 Claims, 5 Drawing Sheets

Prior art

SEMICONDUCTOR FILM WITH LOW CRYSTAL DEFECT AND SEMICONDUCTOR DEVICE AND DISPLAY APPARATUS USING THE SEMICONDUCTOR FILM

BACKGROUND OF THE INVENTION

1. Field of the Invention

The present invention relates to a method of forming a polycrystalline semiconductor film, and a semiconductor device and a display apparatus fabricated using the method. More particularly, the present invention relates to a method of forming a polycrystalline semiconductor film, which has a small amount of crystal defects, on a non-single crystal insulating film or a non-single crystal insulating substrate. The polycrystalline semiconductor film is produced by applying heat energy and light energy (strong irradiation) to an amorphous semiconductor film. And the present invention relates to a semiconductor device, such as a liquid crystal driver, a semiconductor memory, a semiconductor logic circuit, and the like, comprising a polycrystalline semiconductor film formed by the method. And the present invention relates to a display apparatus comprising the semiconductor device.

2. Description of the Related Art

Conventionally, there has been a known method of crystallizing an amorphous semiconductor film provided on a non-single crystal insulating film or substrate by applying energy.

An example of such a method is disclosed in TECHNICAL REPORT OF IEICE (the Institute of Electronics, Information and Communication Engineers), Vol. 100, No. 2, ED2000-14 (April, 2000) pp. 27–32 (hereinafter referred to as conventional example 1). Specifically, PE-CVD (Plasma Enhanced Chemical Vapor Deposition) is used to form an amorphous silicon film having a thickness of 45–50 nm on a glass substrate, and thereafter, the amorphous silicon film is irradiated with excimer laser light, so that the film is crystallized into a polycrystalline silicon film having a grain size of 700 nm. In conventional example 1, when a polycrystalline silicon film obtained by this method was used to fabricate a thin film transistor (TFT), the mobility was improved up to 320 cm$^2$/V·sec.

A crystallization method is disclosed in Japanese Laid-Open Publication No. 2000-150382 (hereinafter referred to as conventional example 2). Specifically, a catalytic substance is introduced into a surface of an amorphous silicon film, the resultant amorphous silicon film is crystallized by thermal treatment, followed by irradiation with laser light, whereby a crystalline silicon film having improved crystallinity can be obtained.

FIG. 7 is a schematic diagram for explaining the crystallization method described in conventional example 2.

In the method of conventional example 2, an amorphous silicon film 2 having a thickness of 100 nm is formed on a glass substrate 1 using PE-CVD, and thereafter, a silicon oxide film 3 having a thickness of about 2 nm is formed on the amorphous silicon film 2 in order to improve wettability.

Thereafter, a solution containing nickel, which is a catalytic substance for accelerating crystallization, is applied onto the silicon oxide film 3, followed by spinning and drying, so that a solution film 4 is formed on the silicon oxide film 3.

Thereafter, in this situation, annealing is performed at 550° C. for 4 hours to crystallize the amorphous silicon film 2.

Thereafter, the crystallized silicon film 2 is irradiated with KrF excimer laser light having a wavelength of 248 nm and an energy density of 200–350 mJ/cm$^2$ to improve the crystallinity.

In such a crystallization method of conventional example 2, since crystallization is accelerated by a catalytic substance, a crystalline silicon film can be obtained at low temperature in a short time.

However, the method of conventional example 1 has the following drawback. The irradiation of an amorphous silicon film with laser light is not optimized, so that crystal grains having a small diameter of several micrometers are obtained, potentially leading to a polycrystalline silicon film containing a number of grain boundaries. The grain boundary acts as a recombination center which provides a trap level for carriers. Therefore, when a TFT is fabricated using a polycrystal containing a number of grain boundaries, the mobility of the TFT is reduced.

The method of conventional example 1 also has the following drawback. Since it is not easy to irradiate the entire surface of a large-area substrate uniformly with sufficiently stable laser light, it is difficult to form a silicon film having uniform crystallinity.

The method of conventional example 2 has the following drawback. In the method, the silicon film 2 crystallized with the introduced catalytic substance is irradiated with laser light so as to improve the crystallinity. The optimum conditions for the laser light irradiation are not disclosed. A number of crystal defects may occur in a silicon film formed by the method.

If such a semiconductor film having a number of crystal defects is used to fabricate a semiconductor device (transistor), such as a liquid crystal driver, a semiconductor memory, a semiconductor logic circuit, and the like, problems arise, such as the mobility of carriers is small, the threshold voltage is high, and the like. Moreover, dispersions in carrier mobility and threshold voltage are large between a number of semiconductor devices (transistors) fabricated in a liquid crystal driver, or the like.

SUMMARY OF THE INVENTION

According to an aspect of the present invention, a semiconductor film is provided, which comprises a polycrystalline semiconductor film provided on a substrate having an insulating surface. Nearly all crystal orientation angle differences between adjacent crystal grains constituting the polycrystalline semiconductor film are present in the ranges of less than 10° or 58°–62°.

In one embodiment of this invention, the proportion of the crystal orientation angle differences between adjacent crystal grains of 1°–10° or 58°–62° is 0.5–1.

In one embodiment of this invention, the polycrystalline semiconductor film is made of silicon.

According to another aspect of the present invention, a method of forming a semiconductor film is provided, which comprises the steps of: forming an amorphous semiconductor film on a substrate having an insulating surface; introducing a catalytic substance for accelerating crystallization into a surface of the amorphous semiconductor film; applying first energy to the amorphous semiconductor film to crystallize the amorphous semiconductor film into a crystalline semiconductor film; and applying second energy to the crystalline semiconductor film so that nearly all crystal orientation angle differences between adjacent crystal grains are present in the ranges of less than 10° or 58°–62°. The crystallinity of the crystalline semiconductor film is increased to be turned into a polycrystalline semiconductor film.

In one embodiment of this invention, the first energy is heat energy and the second energy is strong light.

In one embodiment of this invention, the energy density of the strong light is such that after irradiation of the strong light, the proportion of the crystal orientation angle difference between adjacent crystal grains of less than 10° or 58°–62° is highest.

In one embodiment of this invention, the semiconductor film is made of silicon.

In one embodiment of this invention, the catalytic substance is a metal selected from the group consisting of Fe, Co, Ni, Cu, Ge, Pd, and Au, a compound containing at least one of these metals, or a combination of at least one of these metals and a compound containing at least one of these metals.

In one embodiment of this invention, the concentration of the catalytic substance at a surface of the amorphous semiconductor film is greater than or equal to $1 \times 10^{11}$ atoms/cm$^2$ and smaller than or equal to $1 \times 10^{16}$ atoms/cm$^2$.

In one embodiment of this invention, the strong light is excimer laser light.

According to another aspect of the present invention, a semiconductor device is provided, which comprises the above-described semiconductor film.

According to another aspect of the present invention, a display apparatus is provided, which comprises the above-described semiconductor device.

Thus, the invention described herein makes possible the advantages of providing a method of forming a semiconductor film having a reduced number of crystal defects and good crystallinity, and a semiconductor device and a display apparatus fabricated by the method.

These and other advantages of the present invention will become apparent to those skilled in the art upon reading and understanding the following detailed description with reference to the accompanying figures.

DESCRIPTION OF THE PREFERRED EMBODIMENTS

Figure 1:
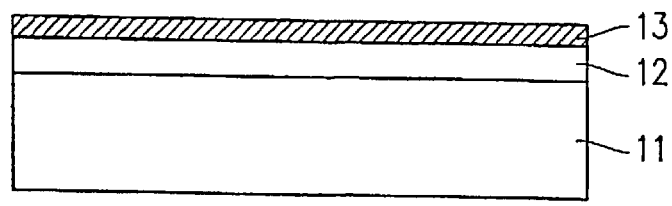
FIG. 1 is a cross-sectional view for explaining a method of forming a crystalline semiconductor film according to Example 1 of the present invention.

The inventors have focused their attention to an appropriate condition for irradiation with excimer laser when an amorphous silicon film is crystallized by introducing a crystallization accelerating catalytic substance thereinto and heating, and the film is irradiated with excimer laser in order to improve the crystallinity. The inventors experimentally revealed that when a crystalline silicon film, of which crystallization has been performed by introduction of a catalytic substance and subsequent thermal treatment, is irradiated with excimer laser under the appropriate condition, nearly all differences in crystal orientation between adjacent crystal grains are present in the ranges of less than 10° or 58°–62°, i.e., good crystallinity with a reduced number of crystal defects.

Such an experiment will be described in detail below.

An amorphous silicon film having a thickness of 50 nm was formed on a glass substrate using PE-CVD, where the film growth temperature was 300° C. and SiH$_4$ gas was used.

Thereafter, a nickel thin film was formed on the amorphous silicon film by sputtering, where the nickel atomic concentration at a surface of the thin film was $1 \times 10^{13} - 5 \times 10^3$/cm$^2$.

Thereafter, the resultant amorphous silicon film was heated in an electric furnace at 550° C. for 4 hours. This thermal treatment allowed the introduced nickel to react with silicon in the amorphous silicon film, whereby nickel silicide was randomly formed on the entire surface of the amorphous silicon film. Further, the nickel silicide acts as a crystal nucleus, accelerating crystallization of the amorphous silicon film. The nickel silicide was moved laterally, crystallizing the amorphous silicon. A crystalline silicon film was formed at sites through which the nickel silicide had passed.

Subsequently, in order to improve the crystallinity of the crystalline silicon film crystallized with the nickel silicide, the film was irradiated with a XeCl excimer laser to form a polycrystalline silicon film (for the sake of clearance, a silicon film after thermal treatment is herein referred to as a crystalline silicon film, and a silicon film after excimer laser irradiation is herein referred to as a polycrystalline silicon film).

The energy density of the excimer laser, which was directed onto a crystalline silicon film after thermal treatment in order to improve the crystallinity, was variously changed in the range of 280 mJ/cm$^2$–380 mJ/cm$^2$ so as to investigate an appropriate condition for the energy density of the excimer laser.

The crystal orientation of a crystalline silicon film obtained by thermal treatment and a polycrystalline silicon film obtained by excimer laser irradiation can be measured by an EBSP (Electron Backscatter Diffraction Pattern) method. In the EBSP method, an electron beam is directed onto a sample whose crystal orientation is to be measured. With an electron back-scatter (Kikuchi) diffraction pattern representing the electron beam scattered by the sample, the crystal orientation is measured with an angle precision of ±1° or less.

In accordance with the EBSP method, a silicon film having an area of 4 $\mu$m×12 $\mu$m was scanned with an electron beam at a measurement pitch of 0.05 $\mu$m, and the angle difference in crystal orientation (i.e., misorientation) between adjacent measurement points was measured.

Figure 6:
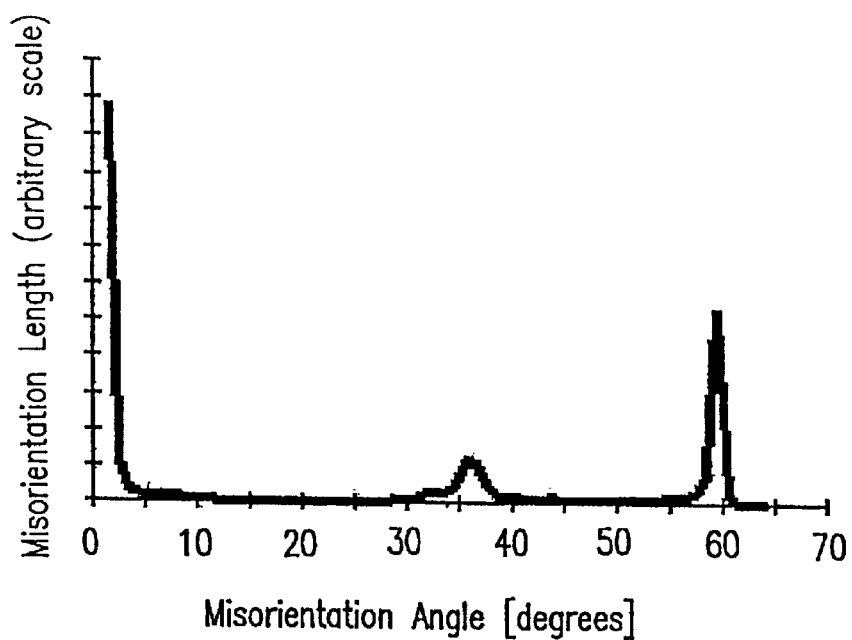
FIG. 6 is a graph showing the misorientation length in a crystalline silicon film after thermal treatment with respect to crystal orientation.
Figure 7:
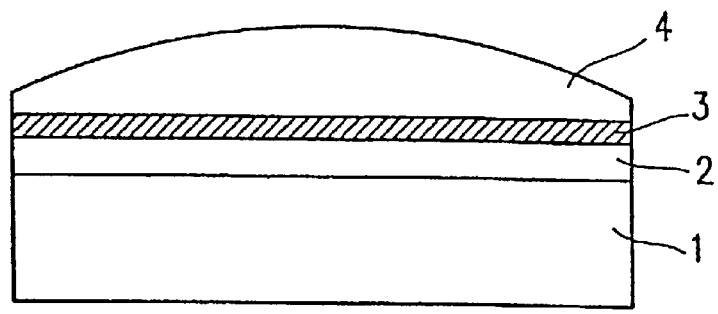
FIG. 7 is a schematic diagram for explaining a crystallization method described in conventional example 2.

FIG. 6 is a graph showing the number of misorientations which occurred in a crystalline silicon film after thermal treatment with respect to crystal orientation, which is converted to length.

Referring to FIG. 6, the misorientation length is distributed from 1°, which is the lower limit of measurement precision, to about 65°. The misorientation length is greater in the ranges of 1°–10° and 58°–62°.

The reason that the misorientation length is greater in the range of 1°–10° is believed as follows.

When the amorphous silicon film containing the introduced nickel was subjected to thermal treatment, nickel reacted with silicon, whereby nickel silicide was randomly formed on the entire surface of the amorphous silicon film. The thus-formed nickel silicide acted as a crystal nucleus for crystallization of the amorphous silicon film. The crystallization proceeded from the crystal nucleus laterally with respect to the substrate.

In the crystallization wherein the nickel silicide acted as a crystal nucleus, crystals were grown in the amorphous silicon film by extending in the form of needles or columns. The crystal orientation gradually changed in the course of the crystal growth so as to relax stress. For this reason, there were many small angle misorientations, and the misorientation length is greater in the range of 1°–10°.

The reason that the misorientation length is greater in the range of 58°–62° is believed as follows.

The crystalline silicon film, which was obtained by subjecting the amorphous silicon film containing the introduced nickel to thermal treatment, was irradiated with an excimer laser in order to improve the crystallinity.

When the energy density of the excimer laser is high, a portion of the crystalline silicon film is locally melted. When the melted crystal is recrystallized, small crystal grains are formed. These small crystal grains are responsible for misorientation in the range of 58°–62°. Note that the crystalline structure causing misorientation in the range of 58°–62° was investigated, and as a result, it was found that the structure is a twin structure. This twin structure is constructed with a crystal having a crystal orientation rotated by 58°–62° with respect to <111> orientation as a rotation axis and a crystal having a crystal orientation before rotation. The boundary between the two crystals has substantially no recombination center.

The results of measurement of the misorientation length of a polycrystalline silicon film are shown in Table 1 below, where the energy density of the excimer laser which was directed onto a crystalline silicon film after thermal treatment was changed in the range of 280 mJ/cm$^2$–380 mJ/cm$^2$. Table 1 shows misorientation length for three regions of misorientation angle, i.e., 1°–10°, 58°–62° and 1°–62°.

Column (d) in Table 1 shows the mobility of an N-channel TFT which was fabricated using a polycrystalline silicon film obtained by irradiation by an excimer laser having each range of energy density.

TABLE 1

| (a) Laser energy density (mJ/cm$^2$) | (b) Misorientation length ($\mu$m) | | | (c) Misorientation length proportion | | | (d) Mobility (cm$^2$/V · sec) |
|---|---|---|---|---|---|---|---|
| | 1°–10° | 58°–62° | 1°–65° | 1°–10° | 58°–62° | 1°–10° 58°–62° | |
| 380 | 200 | 160 | 1500 | 0.13 | 0.11 | 0.24 | — |
| 370 | 160 | 170 | 1300 | 0.12 | 0.13 | 0.25 | — |
| 360 | 210 | 180 | 800 | 0.26 | 0.23 | 0.49 | 180 |
| 350 | 220 | 220 | 750 | 0.29 | 0.29 | 0.59 | 200 |
| 340 | 220 | 180 | 790 | 0.28 | 0.23 | 0.51 | 210 |
| 330 | 390 | 180 | 800 | 0.49 | 0.23 | 0.71 | 220 |
| 320 | 380 | 20 | 500 | 0.76 | 0.04 | 0.8 | 235 |
| 310 | 390 | 20 | 570 | 0.68 | 0.04 | 0.72 | 225 |
| 300 | 500 | 20 | 700 | 0.71 | 0.03 | 0.74 | 220 |
| 280 | 550 | 20 | 750 | 0.73 | 0.03 | 0.76 | 195 |
| 0 | 600 | 20 | 800 | 0.75 | 0.03 | 0.78 | 60 |

Referring to Table 1, when the energy density of the excimer laser was in the range of 280 mJ/cm$^2$–320 mJ/cm$^2$, most misorientations were present in the range of 1°–10°. It is believed that when a low misorientation angle was small, the number of lattice defects was small and the mobility was high. As the energy density of the excimer laser was increased from 280 mJ/cm$^2$–320 mJ/cm$^2$, the misorientation length decreased and the crystallinity was improved. Further, the mobility tends to be increased with an increase in the crystallinity.

When the energy density was increased from 320 mJ/cm$^2$–330 mJ/cm$^2$, the number of misorientations in the range of 58°–62° was rapidly increased. It is considered to be that when an excimer laser having an energy density of 330 mJ/cm$^2$ was applied, the crystalline silicon film was locally melted completely from the surface to the substrate interface, and recrystallization was initiated.

When the energy density of the excimer laser was in the range of 330 mJ/cm$^2$–360 mJ/cm$^2$, most misorientations were present in the ranges of 1°–10° or 58°–62°. In either crystal structure, the number of recombination centers is small, and the electric characteristics are not lowered, thereby obtaining a high mobility.

When a polycrystalline silicon film was irradiated with an eximer laser having an energy density of 320 mJ/cm$^2$ slightly lower than the lowest energy density at which a crystalline silicon film is locally melted completely from the surface to the substrate interface (in the case of Table 1), the misorientation length was small and the quality is considered to be highest. The mobility also had the highest value.

When the energy density exceeded 370 mJ/cm$^2$, the misorientation length was substantially the same in the misorientation angle ranges of 1°–10° and 58°–62°, whereas the misorientation length was great in the misorientation angle range of 1°–62°. The reason is believed to be that after the crystalline silicon was completely melted, the crystalline silicon was precipitated as a very small crystal. In this case, there were a number of misorientations having a misorientation angle other than 1°–10° and 58°–62°, so that a number of recombination centers existed. Therefore, it was considered that the recombination centers acted as a carrier trap level, leading to a reduction in the mobility of a TFT.

According to Table 1, the optimum energy density of excimer laser for a TFT having a mobility of 200 cm$^2$/V·sec, is in the range of 300 mJ/cm$^{2-350}$ mJ/cm$^2$. When crystallization of a polycrystalline silicon film was performed by irradiation of an excimer laser under this condition, most misorientations were present in the angle ranges of 1°–10° or 58°–62°.

The proportion (P) of the crystal orientation difference between adjacent crystal grains is represented by expression (1) below and the proportion is shown in Table 1 above.

When the energy density of the excimer laser was in the range of 300 mJ/cm$^{2-350}$ mJ/cm$^2$, the proportion of the crystal orientation difference between adjacent crystal grains of 1°–10° or 58°–62° was at least 0.5. Therefore, the appropriate proportion was 0.5–1.

The highest mobility was obtained when the proportion of the crystal orientation difference between adjacent crystal grains of 1°–10° or 58°–62° was greatest.

$$P = \frac{\text{misori} \cdot (1° - 10°) + \text{misori} \cdot (58° - 62°)}{\text{misori} \cdot (1° - 65°)} \quad (1)$$

where P represents the proportion of the crystal orientation difference between adjacent crystal grains of 1°–10° or 58°–62°, misori. (1°–10°) represents the misorientation length of misorientation 1°–10°, misori. (58°–62°) represents the misorientation length of misorientation 58°–62°, and misori. (1°–65°) represents the misorientation length of misorientation 1°–65°.

Hereinafter, a method of forming a polycrystalline semiconductor film according to the present invention will be described by way of specific examples with reference to the accompanying drawings. The present invention is not limited to Examples 1 to 4 below.

EXAMPLE 1

FIG. 1 is a cross-sectional view for explaining a method of forming a crystalline semiconductor film according to Example 1 of the present invention.

An amorphous silicon film 12 having a thickness of 50 nm was formed on the entire surface of a glass substrate 11 using PE-CVD. SiH$_4$ gas was used as a material gas for forming a film, and a substrate temperature was 300° C.

Thereafter, a nickel thin film 13 was formed on the entire surface of the amorphous silicon film 12 by depositing nickel (Ni) using a sputtering method. In Example 1, the atomic concentration of nickel in the nickel thin film 13 was 1×10$^{13}$/cm$^2$.

Thereafter, thermal treatment was performed using an electric furnace. Conditions for the thermal treatment were 550° C. and 4 hours, for example. The thermal treatment allowed nickel in the nickel thin film 13 to react with silicon in the amorphous silicon film 12, whereby nickel silicide was formed. The nickel silicide acted as a crystal nucleus, thereby allowing crystallization.

Thereafter, the silicon film 12 crystallized by heating was irradiated with a XeCl excimer laser, thereby improving the crystallinity. In this case, the energy density of the excimer laser was set to be in the range of 300–350 mJ/cm$^2$.

With the above-described steps, a polycrystalline silicon film was formed such that nearly all crystal orientation angle differences between adjacent crystal grains were present in the ranges of less than 100 or 58°–62°.

EXAMPLE 2

Figure 2A:
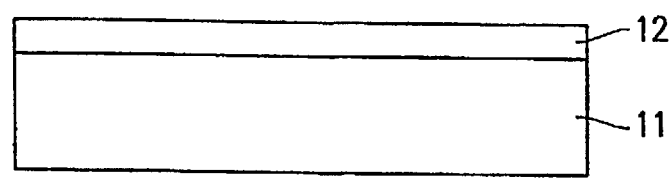
FIGS. 2A and 2B are cross-sectional views for explaining a method of forming a crystalline semiconductor film according to Example 2 of the present invention.
Figure 2B:
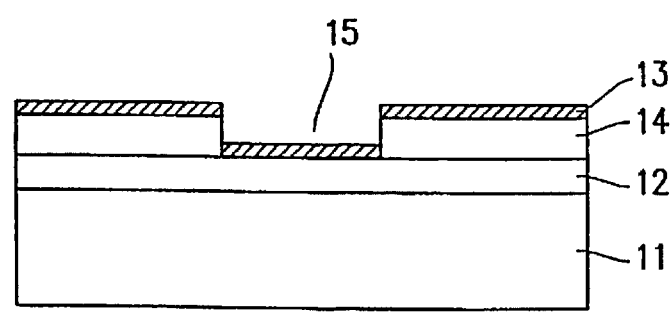

FIGS. 2A and 2B are cross-sectional views for explaining a method of forming a crystalline semiconductor film according to Example 2 of the present invention.

As shown in FIG. 2A, an amorphous silicon film 12 having a thickness of 50 nm was formed on the entire surface of a glass substrate 11 using PE-CVD with SiH$_4$ gas.

Thereafter, a SiO$_2$ film 14 having a thickness of 100 nm was formed on the entire amorphous silicon film 12. Thereafter, a predetermined portion of the SiO$_2$ film 14 was removed by a RIE method, and the portion was used as a catalytic substance introducing region 15. The catalytic substance introducing region 15 was in the shape of a line having a width of 10 µm, for example.

Thereafter, as shown in FIG. 2B, a nickel thin film 13 was formed on the SiO$_2$ film 14 by a sputtering method. In Example 2, the atomic concentration of nickel in the nickel thin film 13 was 5×10$^{13}$/cm$^2$.

Thereafter, thermal treatment was performed using an electric furnace. Conditions for the thermal treatment were 550° C. and 4 hours. The thermal treatment allowed nickel in the catalytic substance introducing region 15 to react with silicon in the amorphous silicon film 12, whereby nickel silicide was formed. The nickel silicide acted as a crystal nucleus, thereby allowing crystallization. The nickel silicide moved laterally with respect to the substrate surface, allowing the silicon in the amorphous silicon film 12 to be crystallized. A crystalline silicone film was formed in the wake of the moving nickel silicide.

Thereafter, the SiO$_2$ film 14 was removed from the silicon film 12 which was turned into crystalline silicon by heating.

Thereafter, the silicon film 12 was irradiated with XeCl excimer laser, thereby improving the crystallinity. In this case, the energy density of the excimer laser was set to be in the range of 300–350 mJ/cm$^2$.

With the above-described steps, a polycrystalline silicon film was formed such that nearly all crystal orientation angle differences between adjacent crystal grains were present in the ranges of less than 10° or 58°–62°.

EXAMPLE 3

Figure 3:
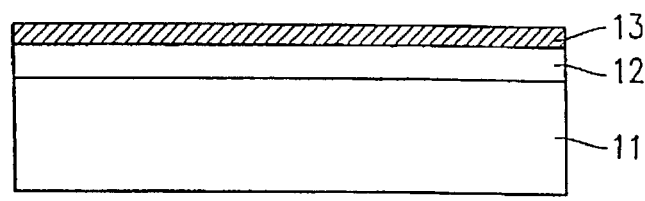
FIG. 3 is a cross-sectional view for explaining a method of forming a crystalline semiconductor film according to Example 3 of the present invention.

FIG. 3 is a cross-sectional view for explaining a method of forming a crystalline semiconductor film according to Example 3 of the present invention.

An amorphous silicon film 12 having a thickness of 50 nm was formed on the entire surface of a glass substrate 11 using PE-CVD. SiH$_4$ gas was used as material gas for forming a film, and a substrate temperature was 300° C.

Thereafter, a nickel thin film 13 was formed on the entire surface of the amorphous silicon film 12 by depositing nickel (Ni) using a sputtering method. In Example 3, the atomic concentration of nickel in the nickel thin film 13 was 1×10$^3$/cm$^2$.

Thereafter, thermal treatment was performed using an electric furnace. Conditions for the thermal treatment were 550°C. and 4 hours, for example. The thermal treatment allowed nickel in the nickelthin film 13 to react with silicon in the amorphous silicon film 12, whereby nickel silicide was formed. The nickel silicide acted as a crystal nucleus, thereby allowing crystallization.

Thereafter, high-temperature thermal treatment (900–1000° C.) was performed, thereby improving the crystallinity thereof. The high-temperature thermal treatment was intended to apply heat energy to the amorphous silicon film 12 instead of laser energy in order to improve the crystallinity thereof. Si was not melted by the high-temperature thermal treatment. The resultant misorientation distribution was substantially the same as that of a polycrystalline silicon irradiated with excimer laser having a laser energy density of 300 mJ/cm$^2$–320 mJ/cm$^2$.

With the above-described steps, a polycrystalline silicon film was formed such that nearly all crystal orientation angle differences between adjacent crystal grains were present in the ranges of less than 10° or 58°–62°.

EXAMPLE 4

Figure 4:
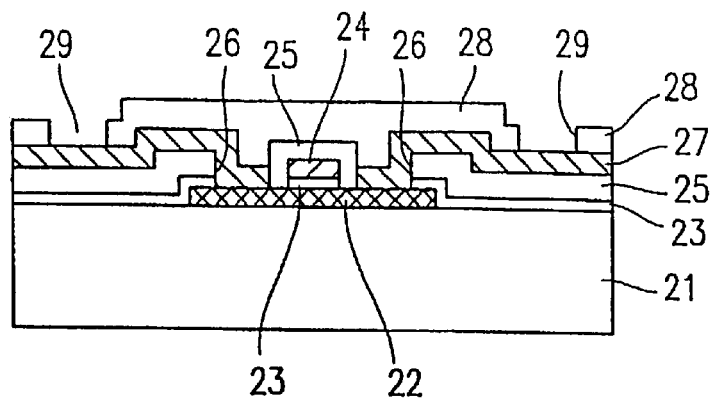
FIG. 4 is a cross-sectional view for explaining a method of forming a semiconductor device according to Example 4 of the present invention.

FIG. 4 is a cross-sectional view for explaining a method of fabricating a semiconductor device according to Example 4 of the present invention.

In Example 4, the crystalline silicon film described in any of Examples 1 to 3 was used to form a semiconductor device, such as a thin film transistor or the like. The semiconductor device fabricated in Example 4 can be used in a liquid crystal driver, a semiconductor memory, a semiconductor logic circuit, or the like.

The method of Example 4 will be specifically described below with reference to FIG. 4.

A polycrystalline silicon film was formed on a glass substrate 21 using the method of fabricating a crystalline semiconductor film described in any of Examples 1 to 3. Thereafter, the polycrystalline silicon film was patterned into a predetermined shape by a RIE method using $CF_4$ gas and $O_2$ gas so as to form an island-shaped polycrystalline silicon film 22. Thereafter, the entire substrate surface with the polycrystalline silicon film 22 was subjected to plasma CVD using TEOS (tetraethoxysilane) gas and $O_3$ gas, thereby forming a gate $SiO_2$ film 23.

Thereafter, a $WSi_2$ layer was formed on the glass substrate 21, on which the gate $SiO_2$ film 23 had been formed, by a sputtering method. Thereafter, a substantially middle portion of the crystalline silicon film 22 was etched by a RIE method using $CF_4$ gas and $O_2$ gas so as to obtain a pattern such that the $WSi_2$ layer remained only on the substantially middle portion. As a result, a $WSi_2$ polycrystalline gate electrode 24 was formed.

Thereafter, an impurity was introduced into the crystalline silicon film 22 in order to form the source and drain regions of a thin film transistor by an ion doping method. In Example 4, the above-described $WSi_2$ polycrystalline gate electrode 24 served as a mask when introducing the impurity. Thus, the impurity was introduced into the crystalline silicon film 22 other than the portion on which the $WSi_2$ polycrystalline gate electrode 24 was provided. When an n-type transistor is formed, an introduced impurity is phosphorous (P). When a p-type transistor is formed, an introduced impurity is boron (B).

Thereafter, an $SiO_2$ film 25 was formed on the entire surface of the glass substrate 21 by a plasma CVD method using TEOS gas and $O_3$ gas. Thereafter, a contact hole 26 was formed on portions of the crystalline silicon film 22, which were to be source and drain regions, by a RIE method using $CF_4$ gas and $CHF_3$ gas.

Thereafter, Al was deposited on the entire substrate surface by a sputtering method. Thereafter, an Al conductor 27, which is electrically connected via the contact hole 26 provided in the $SiO_2$ film 25 to the crystalline silicon film 22 by a RIE method using $BCl_3$ gas and $Cl_2$ gas.

Thereafter, a SiN protection film 28 was formed on the entire substrate surface by a plasma CVD using $SiH_4$ gas, $NH_3$ gas or $N_2$ gas. Thereafter, a portion of the SiN protection film 28 was etched using $CF_4$ gas and $CHF_3$ gas so as to form a through hole 29 which is electrically connected to the Al conductor 27. Thus, a semiconductor device including a semiconductor transistor, a resistor, a capacitor and the like was completed.

EXAMPLE 5

Figure 5A:
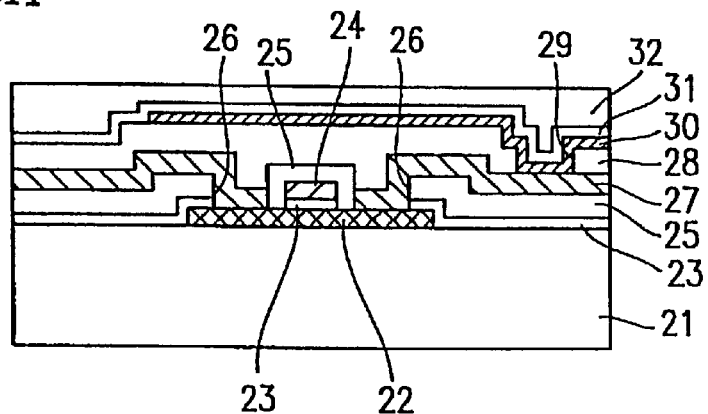
FIGS. 5A and 5B are cross-sectional views for explaining a method of fabricating a display apparatus comprising the semiconductor device according to Example 4.
Figure 5B:
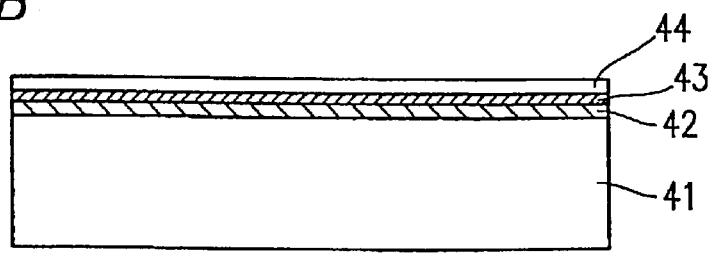

FIGS. 5A and 5B are cross-sectional views for explaining a method of fabricating a display apparatus comprising the semiconductor device according to Example 4.

In Example 5, a method of fabricating a display apparatus, such as a liquid crystal display apparatus, or the like, comprising a semiconductor device fabricated by a method similar to that in Example 4, will be described.

Hereinafter, Example 5 will be described with reference to FIGS. 5A and 5B.

According to the method of Example 4, a semiconductor device was fabricated on an insulating substrate 21, such as a glass substrate. Note that in Examples 4 and 5, like reference characters refer to like parts, and each part of the semiconductor device provided on the insulating substrate 21 is not described in detail.

Thereafter, an ITO film was formed on the entire substrate surface on which a SiN protection film 28 had been provided. Thereafter, the resultant structure was subjected to patterning by etching using HCl gas and $FeCl_3$ gas so as to form a pixel electrode 30 which was electrically connected via a through hole 29 provided in a SiN protection film 28 to an Al conductor 27 of the semiconductor device.

Thereafter, a SiN film 31 was formed on the entire substrate surface by a plasma CVD method using $SiH_4$ gas and $NH_3$ gas or $N_2$ gas. Further, a polyimide film 32 was formed on the SiN film 31 by an offset printing method. The polyimide film 32 was subjected to rubbing treatment so as to act as an alignment film.

On the other hand, as shown in FIG. 5B, a film with R (red), G (green) and B (blue) photosensitive resin films was transcribed to another glass substrate 41 by thermocompression bonding. The resultant structure was subjected to patterning by photolithography. Further, a black matrix portion, which blocks light, was formed between each of the R, G and B photosensitive regions. Thus, a color filter 42 was fabricated.

An ITO film (counter electrode 43) was formed on the entire surface of the color filter 42 by a sputtering method. A polyimide film 44 was formed on the counter electrode 43 by an offset printing method, followed by rubbing treatment.

The glass substrate 41 with the color filter 42 and the like (FIG. 5B) and the glass substrate 21 with the semiconductor device and the like (FIG. 5A) are attached to each other with a sealing resin, where the rubbed sides of the substrates 41 and 21 face each other. In this case, spherical silica particles were distributed between the glass substrates 41 and 21 so that the glass substrates 41 and 21 are uniformly spaced. Liquid crystal (display medium) was injected into the space between the glass substrates 41 and 21, and thereafter, a polarizer was attached to an outer side of each of the glass substrates 41 and 21. A driver IC and the like were mounted on the periphery of the glass substrates 41 and 21. Thus, a liquid crystal display was completed.

Next, the scope of the present invention will be described.

In Examples 1 to 3, the substrate constituting the semiconductor film was a glass substrate or a quartz substrate. A Si wafer with a $SiO_2$ film and a SiN film, or the like can be used as the substrate.

In Examples 1 to 3, a silicon film was fabricated as a specific example of a semiconductor film fabricated by the method of the present invention. The method of fabricating a crystalline semiconductor film according to the present invention is not limited to a silicon film, but can be applied to a SiGe film and the like.

In Examples 1 to 3, an amorphous silicon film was formed by a PE-CVD method using $SiH_4$ gas. Other methods, such as a low-pressure CVD using $Si_2H_6$ gas, a sputtering method, and the like, can be used.

In Examples 1 to 3, the thickness of the semiconductor film was 50 nm. The method of forming a semiconductor film according to the present invention can be applied to formation of a semiconductor film having a thickness of 50–150 nm.

In Examples 1 to 3, nickel as a catalytic substance was introduced by a deposition method using sputtering. Other methods, such as a vacuum deposition method, a plating method, an ion doping method, a CVD method, a spin coating method, and the like, can be used. When the spin coating method is used to introduce a catalytic substance, a solution containing the catalytic substance desirably contains a solvent selected from the group consisting of water, methanol, ethanol, n-propanol, and acetone. When nickel is used as a catalytic substance, nickel acetate may be dissolved in the above-described solvent and the resultant solvent may be applied onto an insulating substrate or an amorphous silicon film.

In Examples 1 to 3, nickel was used as a catalytic substance for accelerating crystallization. A metal selected from the group consisting of Fe, Co, Ni, Cu, Ge, Pd, and Au, a compound containing at least one of these metals, or a combination of at least one of these metals and a compound containing at least one of these metals, can be used.

Examples of a laser used for irradiating a semiconductor film include an excimer laser having a wavelength region corresponding to ultraviolet light, and a YAG laser having a wavelength region corresponding to visible•ultraviolet light. These lasers are selected depending on the type and thickness of a semiconductor film. For example, since the absorbance coefficient of silicon with respect to ultraviolet light is high, an excimer laser having a wavelength region corresponding to ultraviolet light is suitable for melting a thin silicon film. Since the absorbance coefficient of silicon with respect to visible•ultraviolet light is low, a YAG laser having a wavelength region corresponding to visible•ultraviolet light is suitable for melting a thick silicon film. In Examples 1 to 3, since the silicon film was a thin film having a thickness of 50 nm, an excimer laser was suitable.

As described above, a semiconductor film of the present invention is formed by the following steps of: forming an amorphous semiconductor film on a substrate having an insulating surface; introducing a catalytic substance for accelerating crystallization into a surface of the amorphous semiconductor film; applying first energy to the amorphous semiconductor film to crystallize: and applying second energy to the crystalline semiconductor film so that nearly all crystal orientation angle differences between adjacent crystal grains are present in the ranges of less than 10° or 58°–62° wherein the crystallinity of the crystalline semiconductor film is increased to be turned into a polycrystalline semiconductor film. As a result, a polycrystalline semiconductor film having a small number of defects is formed while nearly all crystal orientation angle differences between adjacent crystal grains are present in the ranges of less than 10° or 58°–62°. Such a semiconductor film having the improved crystallinity can be used for a semiconductor device, such as a TFT, thereby making it possible to provide a semiconductor device having higher performance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor film, comprising:
   a polycrystalline semiconductor film provided on a substrate having an insulating surface,
   wherein nearly all crystal orientation angle differences between adjacent crystal grains constituting the polycrystalline semiconductor film are present in the ranges of less than 10°, and 58°–62°.

2. A semiconductor film according to claim 1, wherein the proportion of the crystal orientation angle difference between adjacent crystal grains of 1°–10° or 58°–62° is =0.5–1.

3. A semiconductor film according to claim 1, wherein the polycrystalline semiconductor film is made of silicon.

4. A semiconductor device, comprising a semiconductor film according to claim 1.

5. A display apparatus, comprising a semiconductor device according to claim 4.

6. A semiconductor film according to claim 1, wherein the semiconductor film is produced by irradiating the semiconductor film with a laser.

* * * * *